United States Patent
Wang et al.

(10) Patent No.: US 11,614,518 B2
(45) Date of Patent: Mar. 28, 2023

(54) OPTICAL SENSING IN MEMS PACKAGE FOR LIDAR SYSTEM

(71) Applicant: BEIJING VOYAGER TECHNOLOGY CO., LTD., Beijing (CN)

(72) Inventors: Youmin Wang, Mountain View, CA (US); Yue Lu, Mountain View, CA (US); Zuow-Zun Chen, Mountain View, CA (US)

(73) Assignee: BEIJING VOYAGER TECHNOLOGY CO., LTD., Beijing (CN)

( * ) Notice: Subject to any disclaimer, the term of this patent is extended or adjusted under 35 U.S.C. 154(b) by 364 days.

(21) Appl. No.: 16/909,955

(22) Filed: Jun. 23, 2020

(65) Prior Publication Data

US 2021/0396844 A1 Dec. 23, 2021

(51) Int. Cl.
*G01S 7/481* (2006.01)
*G02B 26/08* (2006.01)
*G01S 17/02* (2020.01)
*B81B 3/00* (2006.01)

(52) U.S. Cl.
CPC ............ *G01S 7/481* (2013.01); *B81B 3/0018* (2013.01); *G01S 17/02* (2013.01); *G02B 26/0833* (2013.01); *B81B 2201/047* (2013.01)

(58) Field of Classification Search
CPC .......... G01S 17/89; G01S 17/02; G01S 17/42; G01S 17/10; G01S 7/4817; G01S 7/481; B81B 3/0018; B81B 2201/047; G02B 26/0833
See application file for complete search history.

(56) References Cited

U.S. PATENT DOCUMENTS

| | | | | |
|---|---|---|---|---|
| 2002/0118518 A1* | 8/2002 | Orcutt | ...................... | H05K 1/14 361/748 |
| 2008/0001850 A1* | 1/2008 | Champion | ................ | H03L 7/18 348/E9.026 |
| 2012/0307211 A1* | 12/2012 | Hofmann | ............. | G02B 26/101 353/31 |
| 2016/0047903 A1* | 2/2016 | Dussan | ................... | G01S 17/89 356/5.01 |
| 2017/0038581 A1* | 2/2017 | Gilboa | ................... | G01S 7/4817 |
| 2017/0285238 A1* | 10/2017 | Hirshberg | ............ | G02B 27/283 |
| 2018/0172984 A1* | 6/2018 | Kimura | ................ | H04N 9/3185 |
| 2019/0196179 A1* | 6/2019 | Sarkar | ................ | G02B 27/1086 |
| 2019/0235229 A1* | 8/2019 | Ujiie | ...................... | G03B 21/28 |
| 2019/0318177 A1* | 10/2019 | Steinberg | ................ | G01S 17/58 |

* cited by examiner

*Primary Examiner* — Sang H Nguyen
(74) *Attorney, Agent, or Firm* — Bayes PLLC

(57) ABSTRACT

Embodiments of the disclosure provide systems and methods for incorporating an optical sensing system in a MEMS package for real-time sensing of angular position of a MEMS mirror. The system may include an optical source configured to emit an optical signal to a backside of the MEMS mirror. The system may also include an optical detector configured to receive a returning optical signal reflected by the backside of the MEMS mirror. The system may further include at least one controller. The at least one controller may be configured to determine a scanning angle of the MEMS mirror based on a position on the optical detector where the returning optical signal is received.

20 Claims, 7 Drawing Sheets

OPTICAL SENSING IN MEMS PACKAGE FOR LIDAR SYSTEM

TECHNICAL FIELD

The present disclosure relates to systems and methods for sensing a scanning angle of a microelectromechanical system (MEMS) mirror in light detection and ranging (LiDAR) systems, and more particularly to, systems and methods for sensing the scanning angle of the MEMS mirror in real-time during LiDAR scanning using an optical sensing system within the MEMS package.

BACKGROUND

LiDAR systems have been widely used in advanced navigation technologies, such as to aid autonomous driving or to generate high-definition maps. For example, a typical LiDAR system measures the distance to a target by illuminating the target with pulsed laser light beams and measuring the reflected pulses with a sensor. Differences in laser light return times, wavelengths, and/or phases can then be used to construct digital three-dimensional (3D) representations of the target. Because using a narrow laser beam as the incident light can map physical features with very high resolution, a LiDAR system is particularly suitable for applications such as sensing in autonomous driving and high-definition map surveys.

Optical components, e.g., a MEMS mirror, used in LiDAR systems includes a micro mirror that can be moved (e.g., rotated) by an actuator to reflect (and steer) incident laser beams. For example, the MEMS micro mirror can be used in the LiDAR transmitter to form a MEMS scanner that steers laser beams from a laser source towards a range of directions in order scan a field of view (FOV). Each direction is known as a scanning angle. At speed, the scanner is a resonant device which scans fastest in the middle of the range and slowest at the beginning or end of each scan. As a result, the center of the scan has the lowest resolution, the opposite of what is wanted for LiDAR systems. To compensate the movement of the mirror in the scanner, the actual position of the mirror needs to be sensed so that feedback control of the micro mirror can be provided.

On the other hand, LiDAR systems may be operated under extreme environmental conditions which may upset the internal optical components (e.g., scanners). For example, external temperature or humidity may vary significantly. Because LiDARs are often mounted on mobile systems and may operate while the mobile systems are moving, LiDAR systems may experience vibrations or motions during operation. These severe interferences may easily affect the performance or lifespan of the optical devices in the LiDAR systems.

Embodiments of the disclosure address the above problems by incorporating an optical sensing system in the MEMS package for real-time sensing of the angular position of the MEMS mirror.

SUMMARY

Embodiments of the disclosure provide an optical sensing system for a MEMS mirror. The system may include an optical source configured to emit an optical signal to a backside of the MEMS mirror. The system may further include an optical detector configured to receive a returning optical signal reflected by the backside of the MEMS mirror. The system may also include at least one controller. The at least one controller may be configured to determine a scanning angle of the MEMS mirror based on a position on the optical detector where the returning optical signal is received.

Embodiments of the disclosure also provide an optical sensing method for a MEMS mirror. The method may include emitting an optical signal, by an optical source, to a backside of the MEMS mirror. The method may further include receiving a returning optical signal, by an optical detector, reflected by the backside of the MEMS mirror. The method may also include determining, by at least one controller, a scanning angle of the MEMS mirror based on a position on the optical detector where the returning optical signal is received.

Embodiments of the disclosure further provide a micromirror assembly. The micromirror assembly may include a MEMS mirror having a frontside for receiving a light signal and a backside. The micromirror assembly may also include an optical source configured to emit an optical signal to the backside of the MEMS mirror. The micromirror assembly may further include an optical detector configured to receive a returning optical signal reflected by the backside of the MEMS mirror. The MEMS mirror, the optical source, and the optical detector may be placed in a compact package.

It is to be understood that both the foregoing general description and the following detailed description are exemplary and explanatory only and are not restrictive of the invention, as claimed.

DETAILED DESCRIPTION

Reference will now be made in detail to the exemplary embodiments, examples of which are illustrated in the accompanying drawings. Wherever possible, the same reference numbers will be used throughout the drawings to refer to the same or like parts.

Embodiments of the present disclosure provide optical sensing systems and methods for sensing an angular position of a MEMS mirror used in LiDAR systems. In some embodiments, the optical sensing system includes an optical source, an optical detector, and at least one controller. Because the LiDAR systems may operate while moving, e.g., equipped on a vehicle, placing the optical position sensing components and the MEMS mirror in a compact package can improve the accuracy of the sensing while keeping the entire sensing system with accessory circuitry in small form factor.

In some embodiments, the LiDAR system may include a transmitter configured to emit a light beam to scan an object and a receiver configured to receive the light beam reflected by the object. The transmitter or the receiver may include one or more micromachined mirror assemblies to reflect light signals to certain directions.

In order to implement closed-loop feedback control to control the movement of a MEMS mirror, the scanning angle of the MEMS mirror has to be accurately measured. In some embodiments, a controller may control one or more actuators to drive the mirror to oscillate. The controller may further trigger an optical source to emit an optical signal to the backside of the MEMS mirror. A returning optical signal reflected by the backside of the MEMS mirror is received by an optical detector. Based on the position on the optical detector where the returning optical signal is received, the controller may determine the scanning angle of the MEMS mirror and further adjust the movement of the MEMS mirror based on the determined scanning angle.

Embodiments of the present disclosure improve the performance of the MEMS mirror and reduce the dimension of the position sensing system of the MEMS mirror. For example, a LiDAR system having the MEMS mirror and the optical sensing system in a compact package can be used in advanced navigation technologies, such as to aid autonomous driving or to generate high-definition maps.

Figure 1:
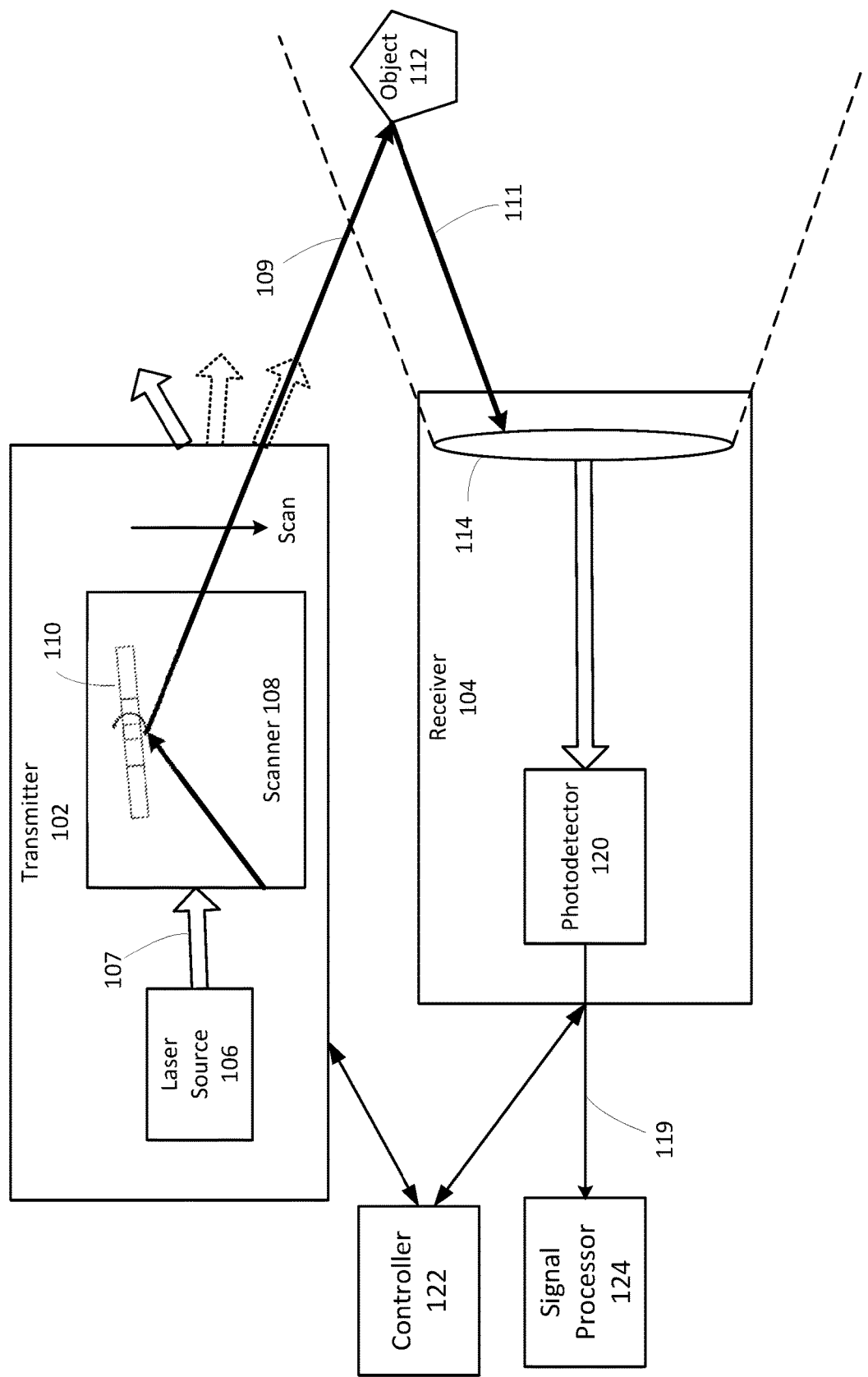
FIG. 1 illustrates a block diagram of an exemplary LiDAR system, according to embodiments of the disclosure.

FIG. 1 illustrates a block diagram of an exemplary LiDAR system 100, according to embodiments of the disclosure. LiDAR system 100 may include a transmitter 102, a receiver 104, and a controller 122. Transmitter 102 may emit laser beams along multiple directions. Transmitter 102 may include one or more laser sources 106 and a scanner 108.

Transmitter 102 can sequentially emit a stream of pulsed laser beams in different directions within a scan range (e.g., a range in angular degrees), as illustrated in FIG. 1. Laser source 106 may be configured to provide a laser beam 107 (also referred to as "native laser beam") to scanner 108. In some embodiments of the present disclosure, laser source 106 may generate a pulsed laser beam in the ultraviolet, visible, or near infrared wavelength range.

In some embodiments of the present disclosure, laser source 106 may include a pulsed laser diode (PLD), a vertical-cavity surface-emitting laser (VCSEL), a fiber laser, etc. For example, a PLD may be a semiconductor device similar to a light-emitting diode (LED) in which the laser beam is created at the diode's junction. In some embodiments of the present disclosure, a PLD includes a PIN diode in which the active region is in the intrinsic (I) region, and the carriers (electrons and holes) are pumped into the active region from the N and P regions, respectively. Depending on the semiconductor materials, the wavelength of incident laser beam 107 provided by a PLD may be smaller than 1,100 nm, such as 405 nm, between 445 nm and 465 nm, between 510 nm and 525 nm, 532 nm, 635 nm, between 650 nm and 660 nm, 670 nm, 760 nm, 785 nm, 808 nm, 848 nm, or 905 nm. It is understood that any suitable laser source may be used as laser source 106 for emitting laser beam 107.

Scanner 108 may be configured to emit a laser beam 109 to an object 112 in a direction within a range of scanning angles. In some embodiments consistent with the present disclosure, scanner 108 may include a micromachined mirror assembly having a rotational mirror, such as MEMS mirror 110. Object 112 may be made of a wide range of materials including, for example, non-metallic objects, rocks, rain, chemical compounds, aerosols, clouds and even single molecules. The wavelength of laser beam 109 may vary based on the composition of object 112. In some embodiments, at each time point during the scan, scanner 108 may emit laser beam 109 to object 112 in a direction within a range of scanning angles by rotating the micromachined mirror assembly. MEMS mirror 110, at its rotated angle, may deflect the laser beam 107 generated by laser sources 106 to the desired direction, which becomes laser beam 109. As will be described below in greater detail, the micromachined mirror assembly may further include an optical sensing system (not shown) within the same package of the mirror assembly. The optical sensing system may be configured to measure the actual scanning angle of MEMS mirror 110 at any given time, which can be used to determine the actual scanning angle and provide feedback control to the scanning process. In some embodiments of the present disclosure, scanner 108 may also include optical components (e.g., lenses, mirrors) that can focus pulsed laser light into a narrow laser beam to increase the scan resolution and the range to scan object 112.

In some embodiments, receiver 104 may be configured to detect a returned laser beam 111 returned from object 112. The returned laser beam 111 may be in a different direction from beam 109. Receiver 104 can collect laser beams returned from object 112 and output electrical signals reflecting the intensity of the returned laser beams. Upon contact, laser light can be reflected by object 112 via backscattering, such as Rayleigh scattering, Mie scattering, Raman scattering, and fluorescence. As illustrated in FIG. 1, receiver 104 may include a lens 114 and a photodetector 120. Lens 114 may be configured to collect light from a respective direction in its field of view (FOV) and converge the laser beam to focus before it is received on photodetector 120. At each time point during the scan, returned laser beam 111 may be collected by lens 114. Returned laser beam 111 may be returned from object 112 and have the same wavelength as laser beam 109.

Photodetector 120 may be configured to detect returned laser beam 111 returned from object 112. In some embodiments, photodetector 120 may convert the laser light (e.g., returned laser beam 111) collected by lens 114 into an electrical signal 119 (e.g., a current or a voltage signal). Electrical signal 119 may be generated when photons are absorbed in a photodiode included in photodetector 120. In some embodiments of the present disclosure, photodetector 120 may include a PIN detector, a PIN detector array, an avalanche photodiode (APD) detector, a APD detector array, a single photon avalanche diode (SPAD) detector, a SPAD detector array, a silicon photo multiplier (SiPM/MPCC) detector, a SiP/MPCC detector array, or the like.

LiDAR system 100 may also include one or more signal processor 124. Signal processor 124 may receive electrical signal 119 generated by photodetector 120. Signal processor 124 may process electrical signal 119 to determine, for example, distance information carried by electrical signal 119. Signal processor 124 may construct a point cloud based on the processed information. Signal processor 124 may include a microprocessor, a microcontroller, a central processing unit (CPU), a graphical processing unit (GPU), a digital signal processor (DSP), or other suitable data processing devices. In some embodiments, signal processor 124 may be part of controller 122.

LiDAR system 100 may further include one or more controllers, such as a controller 122. Controller 122 may control the operation of transmitter 102 and/or receiver 104 to perform detection/sensing operations. Controller 122 may include components (not shown) such as a communication interface, a processor, a memory, and a storage for performing various control functions. In some embodiments, controller 122 may have different modules in a single device, such as an integrated circuit (IC) chip (implemented as, for example, an application-specific integrated circuit (ASIC) or a field-programmable gate array (FPGA)), or separate devices with dedicated functions. In some embodiments, the processor may include any appropriate type of general-purpose or special-purpose microprocessor, digital signal processor, or microcontroller. The memory or storage may be a volatile or non-volatile, magnetic, semiconductor, tape, optical, removable, non-removable, or other type of storage device or tangible (i.e., non-transitory) computer-readable medium including, but not limited to, a ROM, a flash memory, a dynamic RAM, and a static RAM. For example, the memory and/or the storage may be configured to store program(s) that may be executed by the processor to control the operation of scanner 108.

In some embodiments, controller 122 may send control signals to scanner 108 to actuate the rotation of MEMS mirror 110. In some embodiments, controller 122 may control an optical sensing system that senses the actual rotation angle of MEMS mirror 110 and implement a feedback control loop to control MEMS mirror 110 based on the real-time sensing. In some embodiments, the actual rotation angle of MEMS mirror 110 is sensed by an optical system implemented within the same package of MEMS mirror 110.

Figure 2A:
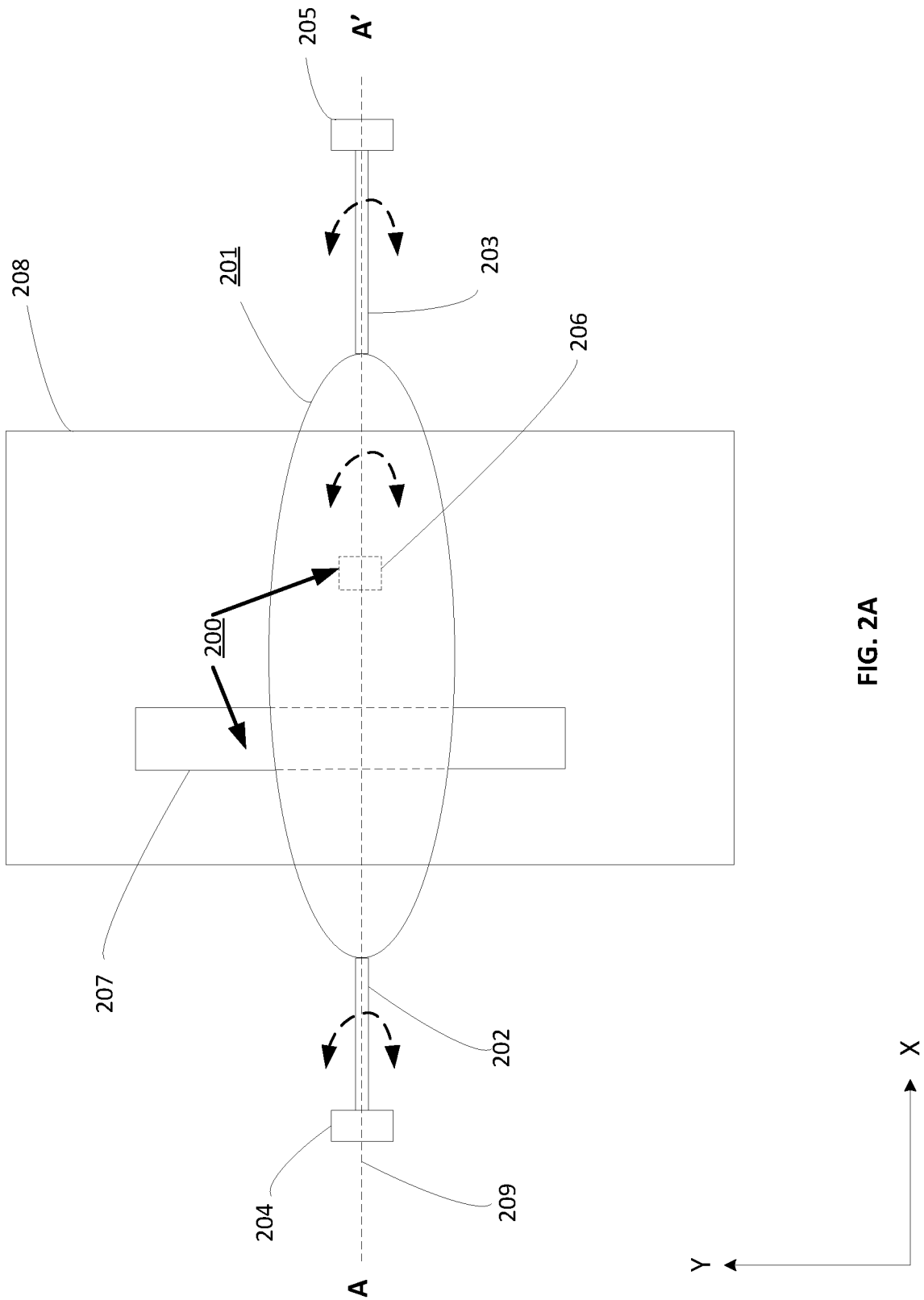
FIG. 2A illustrates a top view of an exemplary MEMS mirror and an optical sensing system for the MEMS mirror, according to embodiments of the disclosure.
Figure 2B:
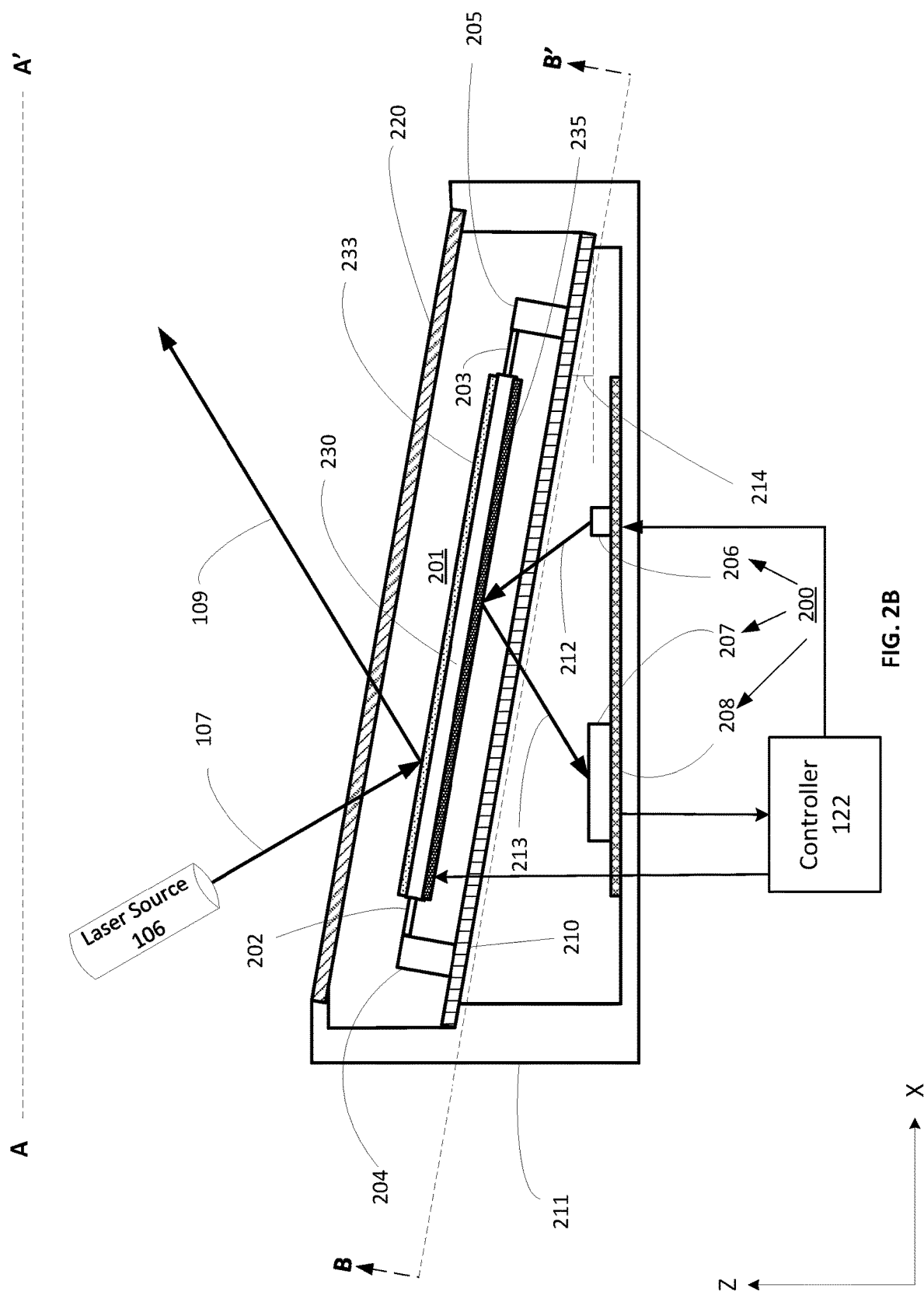
FIG. 2B illustrates a sectional view along line A-A' of the exemplary optical sensing system for the MEMS mirror in FIG. 2A, according to embodiments of the disclosure.
Figure 2C:
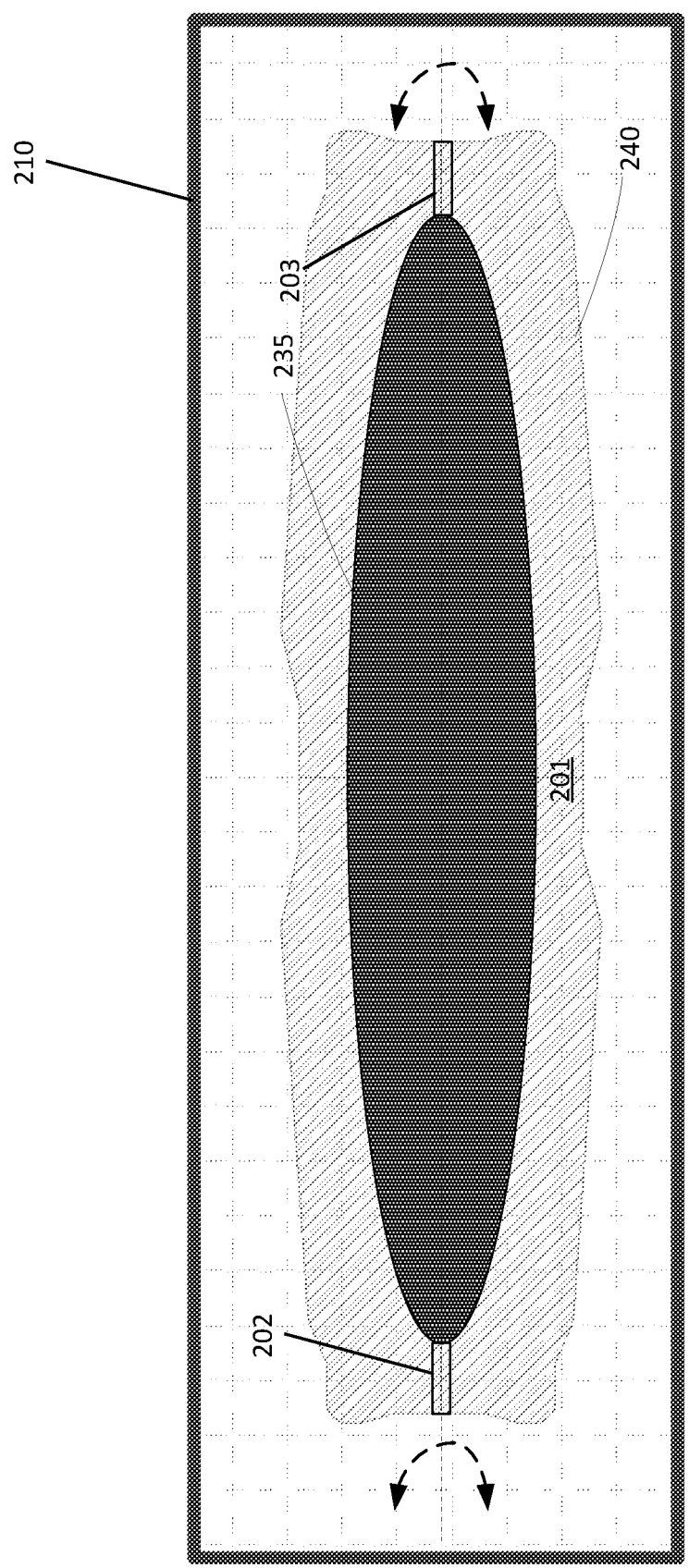
FIG. 2C illustrates a sectional view along line B-B' of the exemplary MEMS mirror in FIG. 2B, according to embodiments of the disclosure.

FIG. 2A illustrates a top view of an exemplary MEMS mirror 201 and an optical position sensing system 200 for the MEMS mirror, according to embodiments of the disclosure. FIG. 2B illustrates a section view along line A-A' of exemplary optical position sensing system 200 in FIG. 2A, according to embodiments of the disclosure. FIG. 2C illustrates a section view along line B-B' of exemplary MEMS mirror 201 in FIG. 2B, according to embodiments of the disclosure. In the following passages, FIGS. 2A-2C are described together. It is also contemplated that the application of the disclosed optical sensing systems and methods is not limited to MEMS mirrors, but can be extended to all rotational mirrors.

In some embodiments, MEMS mirror 201 may be implemented by a single micro mirror or an array of micro mirrors. As shown in FIG. 2A, a first torsion beam 202 is mechanically coupled to one side of MEMS mirror 201, and a second torsion beam 203 is mechanically coupled to the opposite side of MEMS mirror 201.

MEMS mirror 201 may have a frontside (e.g., the top surface of MEMS mirror 201 facing the observer in FIG. 1A) configured to reflect laser beams used for LiDAR scan. As shown in FIG. 2B and FIG. 2C, the frontside of MEMS mirror 201 may include a reflective layer 233 over a top surface of a mirror-base layer 230 a mirror-base layer 230. Mirror-base layer 230 may be made of the same material as torsion beams 202/203 and anchors 204/205. For example, mirror-base layer 230 may be formed together with torsion beams 202/203 and anchors 204/205. In some embodiments, reflective layer 233 may be used to receive laser beam 107 emitted by laser source 106 and reflect laser beam 109 to surround environments. In some embodiments, reflective layer 233 may include a material of sufficiently high reflectivity to light, such as metals. For example, reflective layer 233 includes one or more of aluminum and gold. In some embodiments, an optical filter 220 may be included on the frontside of MEMS mirror 201 to filter the incoming laser beam 107. For example, as shown in FIG. 2B, filter layer 220 may hang over MEMS mirror 201. When MEMS mirror 201 is in its initial state (i.e., non-tilt state), optical filter 220 may be parallel to MEMS mirror 201. With optical filter 220, MEMS mirror 201 can operate without interferences from other light sources, such as the sun and/or other optical sources.

In some embodiments, MEMS mirror 201 may be rotated continuously over a range of angles in order for reflective layer 233 to reflect the laser beams incident on MEMS mirror 201 from different directions. For example, MEMS mirror 201 may be configured to tilt around a tilting axis 209 (also referred to as axis 209). Axis 209 may be defined by torsion beams 202 and 203, as MEMS mirror 201 may tilt due to the rotation of torsion beams 202 and 203. In some embodiments, MEMS mirror 201 may be covered by a reflective layer disposed on its top surface (e.g., facing incident laser beam(s)). The reflective layer may form a reflective surface to reflect an incident laser beam, thereby forming a reflected laser beam. By tilting MEMS mirror 201 to a different angle, the incident laser beam may be reflected to a different direction, forming another reflected laser beam. It is to be understood that although MEMS mirror 201 is in an eclipse shape as shown in FIG. 2A, the shape of MEMS mirror 201 is not limited to an eclipse shape, and may vary in other examples, such as a square, round, or rectangular shape.

MEMS mirror 201 may have a backside opposite to the frontside, which is typically covered by substrate layers and perform no substantive function. Consistent with the present disclosure, the backside of MEMS mirror 201 may be re-purposed as part of an optical sensing system 200, for sensing the actual scanning angle of MEMS mirror 201. As illustrated in FIGS. 2A-2C, optical sensing system 200 may further include an optical source 206 and an optical detector 207 which are placed on the backside of MEMS mirror 110.

In some embodiments, optical source 206 may be mechanically coupled to substrate 208. In some embodiments, optical source 206 may be embedded in or attached to substrate 208. Optical source 206 can be a light source which may be configured to emit an optical sensing signal (e.g., sensing light beam 212). In some embodiments of the present disclosure, optical source 206 may generate a pulsed light beam with a wavelength longer than the wavelength than a visible light and sufficiently different from the wavelength of an operational LiDAR laser beam to avoid interference. For example, the wavelength of sensing light beam 212 may be between 750 nm and 905 nm. In some embodiments, sensing light beam 212 may have a wavelength shorter than the wavelength of the operational LiDAR laser beam. In one specific example, the wavelength of sensing light beam 212 may be selected to be 760 nm and the wavelength of the laser beam used for LiDAR scan may be selected 848 nm. In some embodiments, sensing light beam 212 may have a wavelength longer than the wavelength of the operational LiDAR laser beam. For example, the wavelength of sensing light beam 212 may be selected to be 785 nm and the wavelength of the laser beam used for LiDAR scan may be selected between 445 nm and 465 nm. In some embodiments of the present disclosure, optical source 206 may include a pulsed laser diode (PLD), a vertical-cavity surface-emitting laser (VCSEL), a fiber laser, etc.

In some embodiments, MEMS mirror 201, shown in FIG. 2B, may include a reflective layer 235 over a bottom surface of mirror-base layer 230 shown in FIG. 2B and FIG. 2C. Reflective layer 235 may be used to receive the optical sensing signal (e.g., sensing light beam 212) emitted by optical source 206 and reflect the optical sensing signal (e.g., returning sensing light beam 213). If the optical sensing signal is outside a predetermined set of wavelengths, it may not be reflected by reflective layer 235. Reflective layer 235 may be a coating layer which can be made of different materials than reflective layer 233 so that to reflect light beams of different wavelengths. For example, reflective layer 235 may include one or more of silicon dioxide ($SiO_2$), silicon nitride (SiN), titanium (II) oxide (TiO), and $Al_2O_3$. Reflective layer 235 may be deposited by any suitable deposition methods such as one or more of physical vapor deposition process, chemical vapor deposition process, atomic layer deposition, electroplating, electrodeless plating, spin-coating, spray-coating, or a combination thereof.

Optical detector 207 may also be embedded in or attached to substrate 208. In some embodiments, optical detector 207 can include a plurality of photodetectors, or a position sensitive device (PSD). Optical detector 207 can receive a retuning sensing light beam 213 reflected by reflective layer 235 on the backside of MEMS mirror 201. Optical detector 207 may send an electrical signal to controller 122 indicative of the position of a light spot on optical detector 207 where sensing light beam 213 is received. Based on the position of the received light beam 213, controller 122 may be configured to determine the reflection angle of the sensing light beam, thus determining the actual scanning angle of MEMS mirror 201.

Based on the actual scanning angle of MEMS mirror 201, controller 122 may provide closed-loop feedback control to MEMS mirror 201, e.g., by sending control signals to anchors 204 and 205. For example, controller 122 may compare the sensed scanning angle with the angle MEMS mirror 201 was actuated to rotate to (the intended angle). If the sensed scanning angle is smaller than the intended angle, controller 122 may send a control signal to actuate MEMS mirror 201 to increase the scanning angle. Otherwise, if the sensed scanning angle is larger than the intended angle, controller 122 may send a control signal to pull MEMS mirror 201 a bit to decrease the scanning angle. Using the closed-loop control based on a real-time sensing of the actual scanning angle, MEMS mirror 201 may be adjusted to an angle that is truly intended. LiDAR scanning and receiving accuracy can be improved accordingly.

In some embodiments, incident angle of sensing light beam 212 to reflective layer 235 may be adjusted as the scanning angle of MEMS mirror 201 changes (i.e., as MEMS mirror 201 rotates). For example, the incident angle can be varied from 0 degree to 20 degrees. In some embodiments, if sensing light beam 212 is outside the predetermined set of incident angles, sensing light beam 212 may not be reflected by reflective layer 235 thus sensing light beam 213 may not be detected. Divergence angle of returning sensing light beam 213 may also vary as the scanning angle of MEMS mirror 201 changes. For example, the divergence angle can change from 10 degrees to 40 degrees depending on the scanning angle of MEMS mirror 201.

Substrate 208 may be made of insulator materials, for example, silicon dioxide (SiO2). In some embodiments, when MEMS mirror 201 is in its initial state (i.e., non-tilt state), MEMS mirror 201 may be parallel to substrate 208. In other words, the relative angle between MEMS mirror 201 and substrate 208 is zero degree. In some embodiments, the relative angle between MEMS mirror 201 in its non-tilt state and substrate 208 can also be non-zero degree. As shown in FIG. 2B, angle 214 denotes the relative angle between MEMS mirror 201 and substrate 208. In some embodiments, the relative angle may be between 0 and 15 degrees.

In some embodiments, a filter may be placed between MEMS mirror 201 and optical source 206, e.g., an optical filter 210 shown in FIG. 2B. In some embodiments, MEMS mirror 201 may be suspended over optical filter 210 (as shown in FIG. 2B and FIG. 2C) by torsion beams 202 and 203 that may be mechanically coupled to filter 210 through anchors 204 and 205. In such embodiments, when MEMS mirror 201 is in its non-tilt state, optical filter 210 may be parallel to MEMS mirror 201. Optical filter 210 is used to filter sensing light beam 212 emitted by optical source 206 before it impinges on reflective layer 235. Light signals from other light sources, such as the sun and/or other LiDAR systems (e.g., laser source 106) can be suppressed by optical filter 210 so that they do not interfere with sensing light beam 212. For example, optical filter 210 may block optical signals with wavelengths less than that of a visible light. In some embodiments, optical filter 210 may further block optical signals with the same of substantially similar wavelength as that of laser beams 107/109 for LiDAR scan. For example, if the wavelength of laser beams 107/109 is 905 nm, optical filter 210 may suppress optical signals having wavelengths equal to or close to 905 nm.

In some embodiments, the MEMS mirror assembly including, e.g., MEMS mirror 201, torsion beams 202/203, and anchors 204/205 may be packaged with optical sensing system 200 including, e.g., optical source 206, detector 207 and substrate 208, within a same compact package 211. As shown in FIG. 2B, substrate 208 may be installed on the bottom of package 211 and optical source 206 and detector 207 are attached to substrate 208. By placing the sensing system within the same package as the MEMS mirror assembly, a small form factor may be achieved and relative displacement of the sensing system and the MEMS mirror assembly that it is sensing may be minimized.

In some embodiments, controller 122 may be located outside package 211. Controller 122 may send an electrical signal to optical source 206 to control its emission of an optical signal to reflective layer 235. Returning light beam 213 is received by optical detector 207 which may send an electrical signal to controller 122 (discussed in detail in connection with FIG. 4). Controller 122 may send control signals to MEMS mirror 201 (e.g., its actuators shown in FIG. 3) to perform closed-loop feedback control. It is contemplated that in some alternative embodiments, a dedicated controller may also be included in package 211 to control optical sensing system 200.

As shown by FIG. 2B and FIG. 2C, cavity 240 may be etched on the backside substrate of MEMS mirror 201 so that the opposite side of MEMS mirror 201 can be exposed. That is, the backside of MEMS mirror 201 is open to sensing light beams emitted by optical source 206. The bottom surface of the etched backside is then coated with reflective layer 235 for reflecting sensing light beam 212. For example, sensing light beam 212 can reach reflective layer 235 on the backside of MEMS mirror 201. Returning sensing light beam 213 can reach the surface of the optical detector 207.

Figure 3:
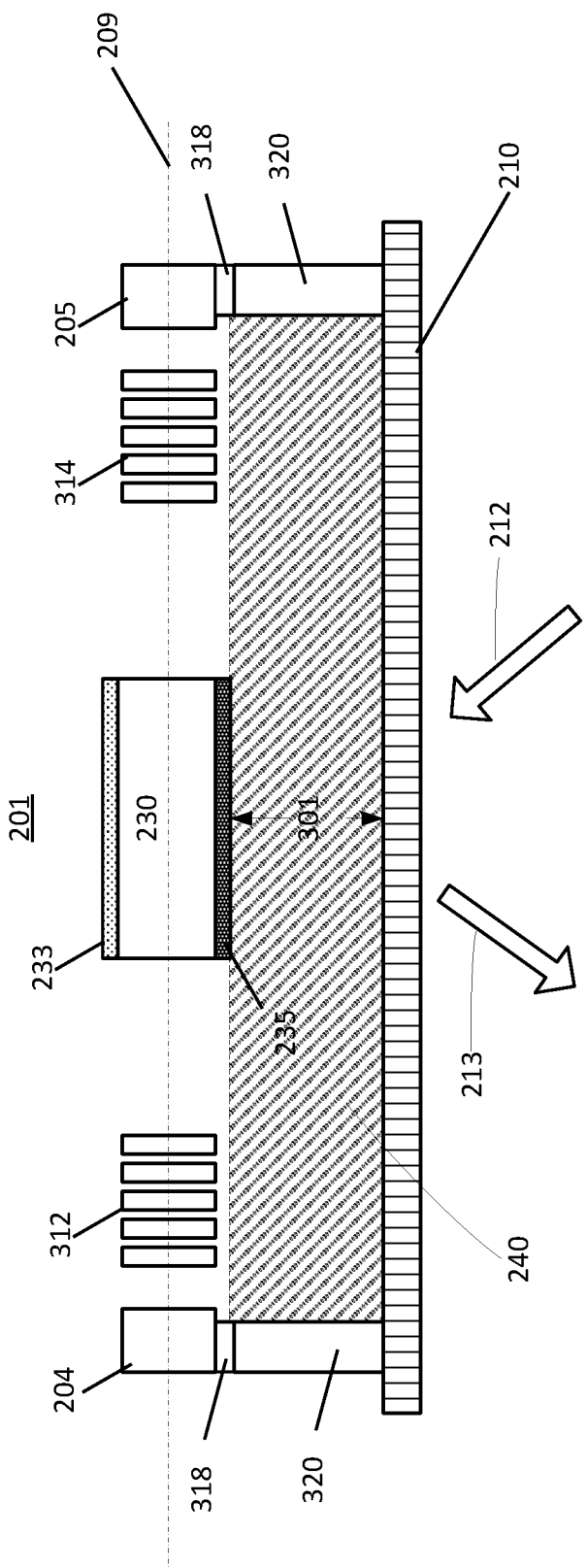
FIG. 3 illustrates a sectional view of the exemplary MEMS mirror in FIGS. 2A-2C, according to embodiments of the disclosure.

FIG. 3 illustrates a cross-sectional view of exemplary MEMS mirror 201 in FIGS. 2A-2C, according to embodiments of the disclosure. In some embodiments, as shown in FIG. 3, MEMS mirror 201 may be actuated by a pair of first and second actuators 312 and 314 mechanically coupled to pair of torsion beams 202 and 203, respectively. A first actuator 312 may be configured to apply a first torsional force around axis 209 to a first torsion beam 202, and a second actuator 314 may be configured to apply a second torsional force around axis 209 to a second torsion beam 203. In some embodiments, the first torsional stress and second torsional stress have the same predetermined magnitudes resulting in torsion beams 202 and 203 along with MEMS mirror 201 to rotate along axis 209 at substantially the operational resonant frequency of MEMS mirror 201 (e.g., at the operational resonant frequency of MEMS mirror 201). Controller 122 may send control signals to actuators 312 and 314 to adjust the scanning angle of MEMS mirror 201.

In some embodiments, anchors 204/205 may be fixed to optical filter 210 through an insulator layer 318. For example, insulator layer 318 may include thermal oxide materials such as silicon dioxide ($SiO_2$). In some embodiments, insulator layer 318 may be connected to optical filter 210 through semiconductor layer 320. Semiconductor layer 320 may be formed using MEMS microfabrication techniques from a same semiconductor structure as anchors 204/205, such as a single crystalline silicon wafer.

As shown in FIG. 3, cavity 240 may be etched on the backside substrate (e.g., insulator layer 318 and/or semiconductor layer 320) of MEMS mirror 201 to allow sensing light beam 212 that goes through optical filter 210 to reach reflective layer 235. Cavity 240 may also be used to allow returning sensing light beam 213 to pass through optical filter 210 and reach optical detector 207. Cavity 240 may have a cavity height 301. In some embodiments, cavity height 301 can be a predetermined value to provide sufficient clearance such that MEMS mirror 201 can rotate along axis 209 without touching optical filter 210.

Figure 4:
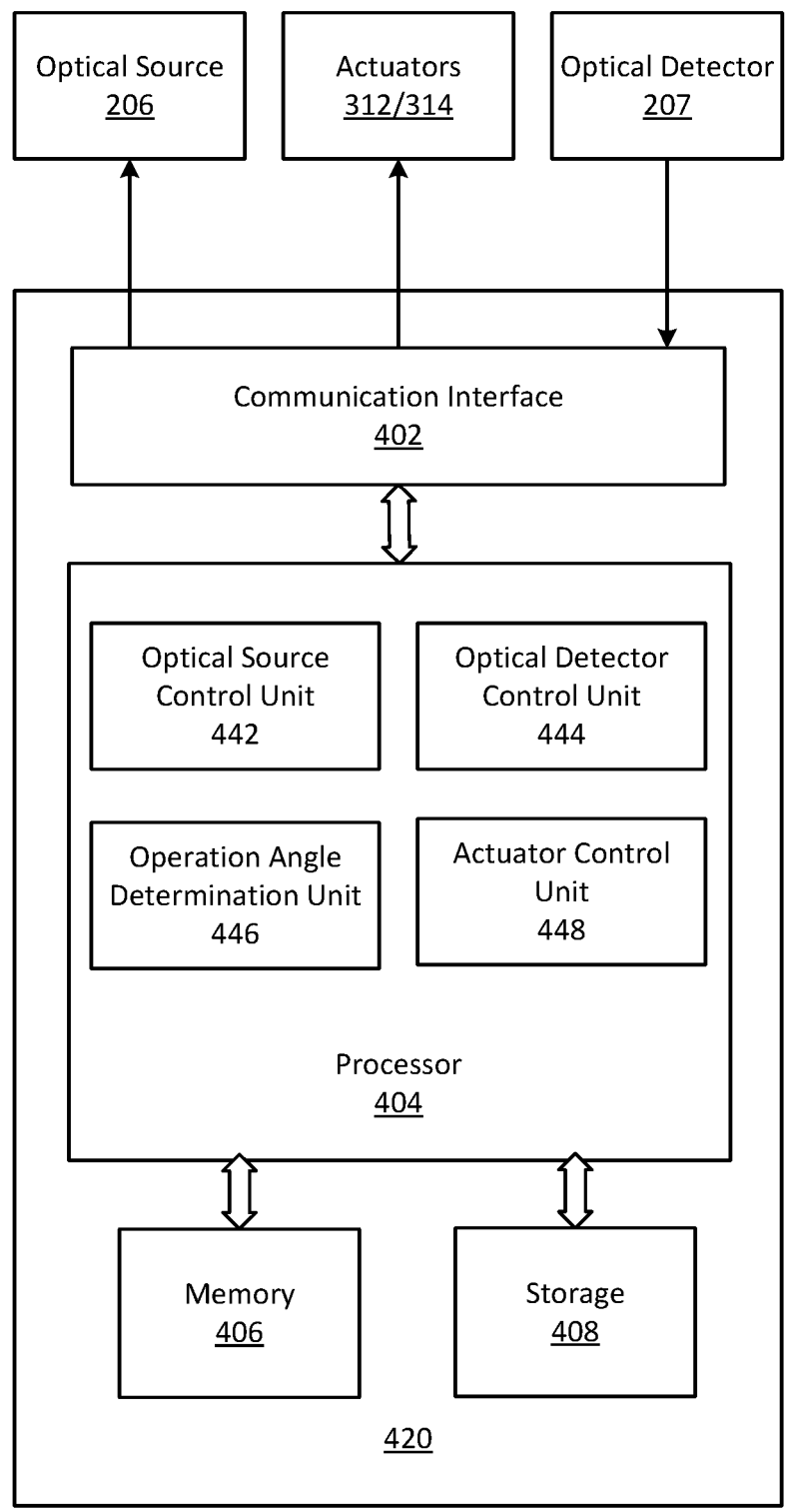
FIG. 4 illustrates a block diagram of an exemplary controller, according to embodiments of the disclosure.

FIG. 4 illustrates a block diagram of an exemplary controller 122, according to embodiments of the disclosure. Controller 122 may send an electrical signal to actuators 312/314 to drive MEMS mirror 201 in scanner 108 to oscillate. Controller 122 may also control optical source 206 to emit optical signals to the backside of MEMS mirror 201. Controller 122 may further receive a detection signal indicative of position information from the optical detector 207 and determine the scanning angle (e.g., the angular position) of MEMS mirror 201 for feedback controlling MEMS mirror 201 via actuators 312/314.

In some embodiments, as shown in FIG. 4, controller 122 may include a communication interface 402, a processor 404, a memory 406, and a storage 408. In some embodiments, controller 122 may have different modules in a single device, such as an integrated circuit (IC) chip (implemented as an application-specific integrated circuit (ASIC) or a field-programmable gate array (FPGA), or separate devices with dedicated functions. Components of controller 122 may be in an integrated device, or distributed at different locations but communicate with each other through a network (not shown). For example, processor 404 may be a processor on-board LiDAR system 100, a processor inside a stand-alone computing, or a cloud processor, or any combinations thereof.

Communication interface 402 may send data to and receive data from components such as transmitter 202/receiver 204 via communication cables, a Wireless Local Area Network (WLAN), a Wide Area Network (WAN), wireless networks such as radio waves, a nationwide cellular network, and/or a local wireless network (e.g., Bluetooth™ or WiFi), or other communication methods. In some embodiments, communication interface 402 can be an integrated services digital network (ISDN) card, cable modem, satellite modem, or a modem to provide a data communication connection. As another example, communication interface 402 can be a local area network (LAN) card to provide a data communication connection to a compatible LAN. Wireless links can also be implemented by communication interface 402. In such an implementation, communication interface 402 can send and receive electrical, electromagnetic or optical signals that carry digital data streams representing various types of information via a network.

Processor 404 may include any appropriate type of general-purpose or special-purpose microprocessor, digital signal processor, or microcontroller. Processor 404 may be configured as a separate processor module dedicated to controlling the operation of optical sensing system 200. Alternatively, processor 404 may be configured as a shared processor module for performing other functions such as controlling transmitter 202/receiver 204.

As shown in FIG. 4, processor 404 may include multiple modules, such as an optical source control unit 442, an optical detector control unit 444, a scanning angle determination unit 446, an actuator control unit 448, and the like. These modules (and any corresponding sub-modules or sub-units) can be hardware units (e.g., portions of an integrated circuit) of processor 404 designed for use with other components or to execute a part of a program. The program may be stored on a computer-readable medium, and when executed by processor 404, it may perform one or more functions. Although FIG. 4 shows units 442-448 all within one processor 404, it is contemplated that these units may be distributed among multiple processors located near or remotely with each other.

Optical source control unit 442 may be configured to control the operations of optical source 206, such as but not limited to, emitting an optical signal to the backside of MEMS mirror 201 after MEMS mirror 201 is actuated to a new position. In some embodiments, optical source control unit 442 can determine the incident angle of sensing light beam 212 at each time point during the scan and generate a control signal to control the emission of optical source 206. For example, the incident angle can be varied from 0 degree to 20 degrees. In some embodiments, optical source control unit 442 may also determine the wavelength of the sensing signal to be emitted and control optical source 206 emit sensing light beam 212 at the wavelength. For example, the wavelength used may be sufficiently different from the wavelength of the laser beams used for LiDAR scan, which are reflected by the frontside of MEMS mirror 201. As a result, interference between the optical beams on the frontside and on the backside of MEMS mirror 201 may be avoided.

Optical detector control unit 444 may be configured to control the operations of optical detector 207, such as but not limited to, receiving a returning optical signal (e.g., returning sensing light beam 213) reflected by the backside of MEMS mirror 201. Based on the signal sent by optical detector 207, optical detector control unit 444 can determine position information, such as where on optical detector 207 the returning optical signal is received. For example, optical detector control unit 444 can detect the position of the light spot of returning sensing light beam 213 on optical detector 207.

Scanning angle determination unit 446 may be configured to determine the actual scanning angle of MEMS mirror 201 based on the position information of the returning optical signal on optical detector 207, the incident angle of sensing light beam 212, along with the predetermined position of optical source 206. In some embodiments, a lookup table may be created to map each pair of position on optical detector 207 and incident angle of sensing light beam 212 to one of scanning angles of MEMS mirror 201. In one example, the lookup table may be pre-computed and stored in memory 406/storage 408 of controller 122 and retrieved by scanning angle determination unit 446. In another example, the lookup table may be stored and updated in a remote location and retrieved by controller 122 via communication interface 402 as needed. Controller 122 may determine the scanning angle based on the position information using the lookup table.

In some embodiments, controller 122 may calculate the scanning angle of MEMS mirror 201 in real-time. For example, controller 122 may first determine the optical path of sensing light beam 212 and returning sensing light beam 213 based on the incident angle of sensing light beam 212 and the detected position information. Based on the optical path, controller 122 may calculate the reflection angle between sensing light beam 212 and returning sensing light beam 213. Controller 122 may then determine the scanning angle based on the reflection angle. It is contemplated that scanning angle determination unit 446 of controller 122 may use any other suitable approach to dynamically determine the scanning angle based on the position of returning sensing light beam 213 on optical detector 207.

Actuator control unit 448 may be configured to control actuators 312/314 to adjust MEMS mirror 201 based on the determined scanning angle. In some embodiments, closed-loop feedback control may be used. For example, controller 122 can control actuators 312/314 to reduce a torsion speed in the middle of each scan and/or increase the torsion speed at the end of each scan based on a comparison of the sensed actual scanning angle and the intended angle of MEMS mirror 201. The adjustment may improve the performance of LiDAR systems by increasing scan resolution in the center of each scan.

Memory 406 and storage 408 may include any appropriate type of mass storage provided to store any type of information that processor 404 may need to operate. Memory 406 and storage 408 may be a volatile or non-volatile, magnetic, semiconductor, tape, optical, removable, non-removable, or other type of storage device or tangible (i.e., non-transitory) computer-readable medium including, but not limited to, a ROM, a flash memory, a dynamic RAM, and a static RAM. Memory 406 and/or storage 408 may be configured to store one or more computer programs that may be executed by processor 404 to perform control functions of optical source 206, optical detector 207, and actuators 312/314 disclosed herein. For example, memory 406 and/or storage 408 may be configured to store program(s) that may be executed by processor 404 to control operations of optical source 206 and optical detector 207, and process the data to determine the actual scanning angle of MEMS mirror 201 in real-time.

Memory 406 and/or storage 408 may be further configured to store information and data used by processor 404. For instance, memory 406 and/or storage 408 may be configured to store the lookup table for determining the scanning angle. The various types of data may be stored permanently, removed periodically, or disregarded immediately after each scan.

Figure 5:
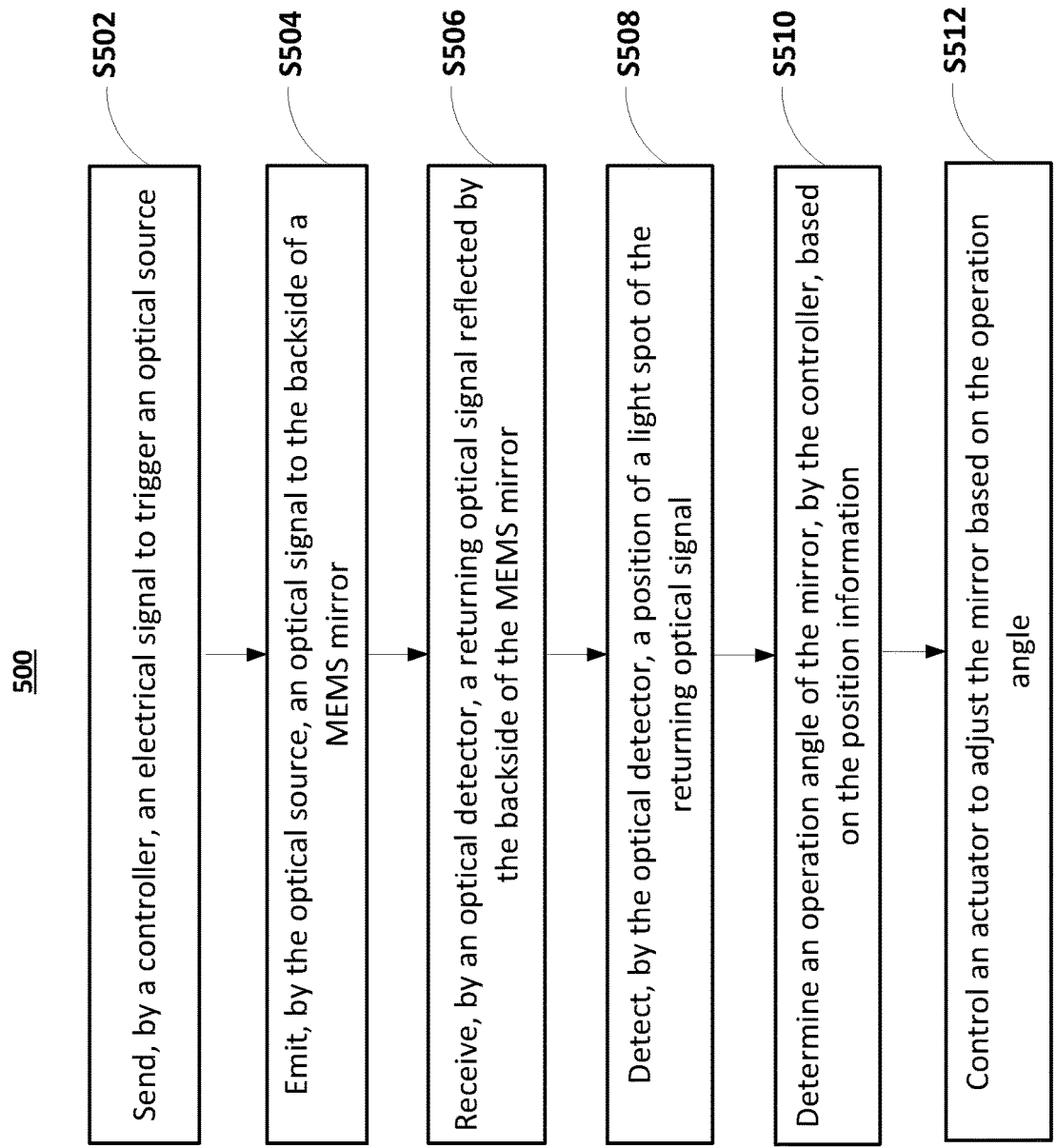
FIG. 5 illustrates a flow chart of an exemplary optical sensing method for a MEMS mirror, according to embodiments of the disclosure.

FIG. 5 illustrates a flow chart of an exemplary optical sensing method 500 for a MEMS mirror, according to embodiments of the disclosure. For example, method 500 may be implemented by optical sensing system 200 along with controller 122 in FIG. 2B. However, method 500 is not limited to that exemplary embodiment. Method 500 may include steps S502-S512 as described below. It is to be appreciated that some of the steps may be optional to perform the disclosure provided herein. Further, some of the steps may be performed simultaneously, or in a different order than shown in FIG. 5.

In step S502, a controller (e.g. controller 122) sends an electrical signal to trigger an optical source (e.g., optical source 206). In some embodiments, the electrical signal may be sent to the optical source after a MEMS mirror (e.g., MEMS mirror 201) is rotated to a new angular position. For example, controller 122 may receive an electrical signal indicative of a new scanning angle of MEMS mirror 201. Controller 122 then sends a trigger signal to optical source 206. In alternative embodiments, controller 122 may send trigger signals periodically without knowing that the scanning angle of MEMS mirror 201 has changed.

In step S504, the optical source emits an optical signal to the backside of the MEMS mirror. In some embodiments, the wavelength of the optical signal (e.g., sensing light beam 212) may be different from that of an operational LiDAR laser beam (e.g., laser beam 107) to avoid signal interference. To ensure the optical signal can go through a filter (e.g., optical filter 210) and reach the backside (e.g., reflective layer 235) of the MEMS mirror, incident angle of the optical signal may be set within a predetermined range (e.g., between 0 degree and 20 degrees).

In step S506, once reaching the backside of the MEMS mirror, the optical signal may be reflected by the backside of the MEMS mirror. A returning optical signal (e.g., returning sensing light beam 213) may be received on the surface of an optical detector (e.g., optical detector 207). Divergence angle of the returning sensing light beam may vary. For example, the divergence angles can change from 10 degrees to 40 degrees.

In step S508, after receiving the returning optical signal (e.g., returning sensing light beam 213), the position of a light spot on the surface of the optical detector where the returning optical signal is received may be detected. Each individual scanning angle of the MEMS mirror may correspond to a unique pair of the incident angle of the sensing signal and its returning position on the surface of the optical detector.

In step S510, the optical detector may send an electrical signal indicative of the position information to the controller. The controller may determine the scanning angle of the MEMS mirror based on the position information. For example, controller 122 can determine the scanning angle of MEMS mirror 201 based on the received signal by using a lookup table or according to a formula.

In step S512, based on the determined scanning angle of the MEMS mirror, the controller can change a torsion speed/rate of the MEMS mirror by sending signals to control the actuators. For example, if the determined scanning angle is greater than an intended one, controller 122 may control actuators 312/314 to decrease the torsion speed of MEMS mirror 201.

Another aspect of the disclosure is directed to a non-transitory computer-readable medium storing instructions which, when executed, cause one or more processors to perform the methods, as discussed above. The computer-readable medium may include volatile or non-volatile, magnetic, semiconductor-based, tape-based, optical, removable, non-removable, or other types of computer-readable medium or computer-readable storage devices. For example, the computer-readable medium may be the storage device or the memory module having the computer instructions stored thereon, as disclosed. In some embodiments, the computer-readable medium may be a disc or a flash drive having the computer instructions stored thereon.

It will be apparent to those skilled in the art that various modifications and variations can be made to the disclosed system and related methods. Other embodiments will be apparent to those skilled in the art from consideration of the specification and practice of the disclosed system and related methods.

It is intended that the specification and examples be considered as exemplary only, with a true scope being indicated by the following claims and their equivalents.

The invention claimed is:

1. An optical sensing system for sensing a scanning angle of a MEMS mirror, wherein the MEMS mirror is used to receive and steer a light signal on a frontside of the MEMS mirror at the scanning angle, comprising:
   an optical source configured to emit an optical signal to a backside of the MEMS mirror;
   an optical detector configured to receive a returning optical signal reflected by the backside of the MEMS mirror;
   an optical filter configured to suppress light signals other than the optical signal, wherein the suppressed light signals comprise the sun light or the light signal received on the frontside of the MEMS mirror;
   at least one controller configured to determine the scanning angle of the MEMS mirror based on a position on the optical detector where the returning optical signal is received.

2. The system of claim 1, wherein the optical source and the optical detector are placed in a compact package with the MEMS mirror.

3. The system of claim 1, wherein the optical filter is placed between the MEMS mirror and the optical source.

4. The system of claim 1, wherein a substrate on the backside of the MEMS mirror is etched with a cavity to allow an optical path for the optical signal to reach the MEMS mirror.

5. The system of claim 1, wherein the backside of the MEMS mirror is coated with a coating layer comprising silicon dioxide ($SiO_2$), silicon nitride (SiN), titanium (II) oxide (TiO), or $Al_2O_3$, and the coating layer is configured to suppress light signals having wavelengths different from that of the optical signal emitted by the optical source.

6. The system of claim 1, wherein the optical signal emitted by the optical source has a wavelength different from that of a light signal received on a frontside of the MEMS mirror.

7. The system of claim 1, wherein the optical source is a pulsed laser diode (PLD) or a vertical-cavity surface-emitting laser (VCSEL).

8. The system of claim 1, wherein the optical detector is a detector array comprising a plurality of photodetectors or a position sensitive device (PSD).

9. The system of claim 1, wherein the at least one controller is further configured to trigger the optical source to emit the optical signal after the MEMS mirror is actuated to a new scanning angle.

10. The system of claim 1, wherein the at least one controller is further configured to control an actuator to adjust the MEMS mirror based on the determined scanning angle.

11. The system of claim 1, wherein the at least one controller is further configured to adjust an incident angle of the optical signal to the backside of the MEMS mirror.

12. An optical sensing method for sensing a scanning angle of a MEMS mirror, comprising:
   receiving and steering a light signal on a frontside of the MEMS mirror;
   emitting an optical signal, by an optical source, through an optical filter to a backside of the MEMS mirror, wherein the optical filter suppresses light signals other than the optical signal, wherein the suppressed light signals comprise the sun light or the light signal received on the frontside of the MEMS mirror;
   receiving a returning optical signal, by an optical detector, reflected by the backside of the MEMS mirror; and
   determining, by at least one controller, the scanning angle of the MEMS mirror based on a position on the optical detector where the returning optical signal is received.

13. The method of claim 12, wherein the optical source, the MEMS mirror, and the optical detector are placed in a compact package.

14. The method of claim 12, wherein the optical filter is placed between the MEMS mirror and the optical source.

15. The method of claim 12, further comprising suppressing optical signals having wavelengths different from that of the optical signal emitted by the optical source using a coating layer comprising silicon dioxide ($SiO2$), silicon nitride (SiN), titanium (II) oxide (TiO), or $Al_2O_3$.

16. The method of claim 12, wherein the optical signal emitted by the optical source has a wavelength different from that of a light signal received on a frontside of the MEMS mirror.

17. The method of claim 12, further comprising triggering the optical source, by the at least one controller, to emit the optical signal after the MEMS mirror is actuated to a new scanning angle.

18. The method of claim 12, further comprising controlling an actuator, by the at least one controller, to adjust the MEMS mirror based on the determined scanning angle.

19. A micromirror assembly, comprising:
   a MEMS mirror having a frontside for receiving and steering a light signal and a backside;
   an optical source configured to emit an optical signal to the backside of the MEMS mirror;
   an optical filter configured to suppress light signals other than the optical signal, wherein the suppressed light signals comprise the sun light or the light signal received on the frontside of the MEMS mirror; and
   an optical detector configured to receive a returning optical signal reflected by the backside of the MEMS mirror, wherein the MEMS mirror, the optical source, and the optical detector are placed in a compact package.

20. The micromirror assembly of claim 19, wherein the MEMS mirror is further coupled to at least one controller configured to determine a scanning angle of the MEMS mirror based on a position on the optical detector where the returning optical signal is received.

\* \* \* \* \*